United States Patent
Abul-Haj et al.

(10) Patent No.: US 7,751,192 B2
(45) Date of Patent: Jul. 6, 2010

(54) HEATSINK METHOD AND APPARATUS

(75) Inventors: Roxanne E. Abul-Haj, Mesa, AZ (US); N. Alan Abul-Haj, Mesa, AZ (US); Timothy W. Stippick, Phoenix, AZ (US); Kevin H. Hazen, Gilbert, AZ (US)

(73) Assignee: Sensys Medical, Inc., Chandler, AZ (US)

( * ) Notice: Subject to any disclaimer, the term of this patent is extended or adjusted under 35 U.S.C. 154(b) by 519 days.

(21) Appl. No.: 11/836,755

(22) Filed: Aug. 9, 2007

(65) Prior Publication Data

US 2007/0272400 A1 Nov. 29, 2007

Related U.S. Application Data

(62) Division of application No. 11/182,309, filed on Jul. 14, 2005, now Pat. No. 7,593,230.

(60) Provisional application No. 60/678,433, filed on May 5, 2005.

(51) Int. Cl.
*H05K 7/20* (2006.01)

(52) U.S. Cl. ............... 361/703; 361/702; 361/704; 361/709; 361/710; 165/80.3; 165/185

(58) Field of Classification Search ............... None
See application file for complete search history.

(56) References Cited

U.S. PATENT DOCUMENTS

| | | | |
|---|---|---|---|
| 3,766,440 A | 10/1973 | Baird | |
| 3,790,859 A | 2/1974 | Schraeder et al. | |
| 3,961,666 A | 6/1976 | Wang et al. | |
| 4,594,643 A * | 6/1986 | Hermann | 361/715 |
| 4,638,858 A * | 1/1987 | Chu | 165/185 |
| 4,899,210 A | 2/1990 | Lorenzetti et al. | |
| 5,099,550 A | 3/1992 | Beane et al. | |
| 5,155,579 A | 10/1992 | Au Yeung | |
| 5,241,453 A | 8/1993 | Bright et al. | |
| 5,729,052 A | 3/1998 | Tonti et al. | |
| 5,829,514 A * | 11/1998 | Smith et al. | 165/78 |
| 5,873,407 A | 2/1999 | Wang et al. | |
| 5,894,882 A * | 4/1999 | Kikuchi et al. | 165/80.3 |
| 6,025,643 A | 2/2000 | Auger | |
| 6,045,240 A | 4/2000 | Hochstein | |
| 6,142,497 A | 11/2000 | Baldomero et al. | |
| 6,269,863 B1 | 8/2001 | Wyler | |
| 6,339,875 B1 | 1/2002 | Larson | |
| 6,375,340 B1 | 4/2002 | Biebl et al. | |

(Continued)

FOREIGN PATENT DOCUMENTS

GB 2165351 4/1986

*Primary Examiner*—Boris L Chervinsky
(74) *Attorney, Agent, or Firm*—Michael A. Glenn; Glenn Patent Group

(57) ABSTRACT

A heatsink having tapered geometry that improves passive cooling efficiency is discussed. A tapered geometry between heatsink heat dissipation elements, as a function of distance along a z-axis opposing gravity, decreases resistance to rarification of passively flowing cooling gas upon heating. Thus, the tapered heatsink elements result in higher velocity of gas flow and increased cooling efficiency of the heatsink. Optionally, the heatsink is made from a thermally conductive polymer allowing the heatsink to be created in complex shapes using injection molding.

10 Claims, 10 Drawing Sheets

U.S. PATENT DOCUMENTS

| | | |
|---|---|---|
| 6,437,469 B1 | 8/2002 | Davis et al. |
| 6,538,888 B1 | 3/2003 | Wei et al. |
| 6,601,299 B2 | 8/2003 | Larson |
| 6,644,395 B1 | 11/2003 | Bergin |
| 6,741,466 B1 | 5/2004 | Lebo |
| 6,830,097 B2 | 12/2004 | Wattelet et al. |
| 6,846,575 B2 | 1/2005 | Hasz et al. |
| 6,908,170 B2 | 6/2005 | Merz |
| 6,942,025 B2 | 9/2005 | Nair et al. |
| 6,952,347 B2 | 10/2005 | Baeumel et al. |
| 7,044,212 B1 | 5/2006 | Hofmann |
| 7,154,751 B2 | 12/2006 | Furuyama et al. |
| 7,330,352 B2 * | 2/2008 | Furuyama et al. ............ 361/697 |
| 7,450,386 B2 * | 11/2008 | Silverstein et al. .......... 361/700 |
| 7,588,074 B1 * | 9/2009 | White ........................ 165/185 |
| 2004/0190257 A1 | 9/2004 | Chang |
| 2006/0181878 A1 | 8/2006 | Burkholder |
| 2008/0066888 A1 * | 3/2008 | Tong et al. ................. 165/80.3 |

* cited by examiner

HEATSINK METHOD AND APPARATUS

CROSS REFERENCE TO RELATED APPLICATION

This application:
is a divisional of U.S. patent application Ser. No. 11/182,309 filed Jul. 14, 2005 now U.S. Pat. No. 7,593,230; and claims benefit of U.S. provisional patent application Ser. No. 60/678,433, filed May 5, 2005,
which are all incorporated herein in their entirety by this reference thereto.

BACKGROUND OF THE INVENTION

1. Field of the Invention

The invention relates to a heatsink. More particularly, the invention relates to a heatsink having a novel geometric shape that improves cooling efficiency. Optionally, the heatsink is made from a thermally conductive polymer allowing the heatsink to be created in complex shapes using injection molding.

2. Description of Related Art

Heatsink

K. McCullough, Net-shape molded heat exchanger, U.S. Pat. No. 6,397,941 (Jun. 4, 2002) describes a heat exchange having a thermally conductive main body having a number of thermally conductive arms or heat pipes extending from the main body and thermally conductive fins coupled to the arms or pipes.

S. Barsun, Heatsink with multiple fin types, U.S. Pat. No. 6,659,168 (Dec. 9, 2003) describes a heatsink having a base having a first and second region. The first and second regions have a first and second type of fin, respectively. The heatsink can dissipate heat from multiple regions of a single electronic component with the respective fin type in a more cost effective manner for each region.

B. Self, Heatsink with improved heat dissipation capability, U.S. Pat. No. 6,735,082 (May 11, 2004) describes the use of heatsink pins orientated at more than one angle with respect to the base of the heatsink. Airflow across the base is disrupted by the geometry of the different pin angles, thereby creating turbulence designed to increase the efficiency of the heatsink and to prevent thermal shading.

E. Sagal, K. McCullough, J. Miller, Thermally conductive lamp reflector, U.S. Pat. No. 6,827,470 (Dec. 7, 2004) describe a thermally conductive lamp reflector used to dissipate heat from a light source within the reflector. The reflector assembly includes a composite shell having a metallized layer on its surface and heat dissipating elements on the back of the reflector.

Cool Polymers, Inc., (Warwick, R.I.) http://www.coolpolymers.com/ (Mar. 25, 2004) describe thermally conductive, flexible elastomers made with a variety of base resins and ranges of thermal conductivity from 2 W/m-K to 100 W/m-K, where W is power in watts, m is distance in meters, and K is temperature in Kelvin. Cool Polymers, Inc. supplies either thermally conductive plastic resins, such as pellets, or injection molded parts produced from these resins. The elastomeric heatsinks conform to varying component heights and surfaces eliminating the need for a secondary interface.

Historically, the environment around heatsinks has increased in severity as a function of time. Electronic devices continue to generate more and more heat while the overall dimension of the electronic devices continues to shrink resulting in greater heat per unit volume. Moreover, weight reduction and environmentally friendly materials are sought. As a result, there is a long felt need for a more efficient heatsink, that is optionally operated in the absence of a fan, that is light weight, free of environmental hazards, and that is usable in a large number of geometries.

SUMMARY OF THE INVENTION

The invention relates to a heatsink. More particularly, the invention relates to a heatsink having an expanding or tapered geometry that improves cooling efficiency. A tapered geometry between heatsink heat dissipation elements, as a function of distance along a z-axis opposing gravity, decreases resistance to rarification of passively flowing cooling gas upon heating. Thus, the tapered heatsink elements result in higher passive velocity of gas flow and increased cooling efficiency of the heatsink. Optionally, the heatsink is made from a thermally conductive polymer allowing the heatsink to be created in complex shapes using injection molding.

DETAILED DESCRIPTION OF THE INVENTION

Figure 1:
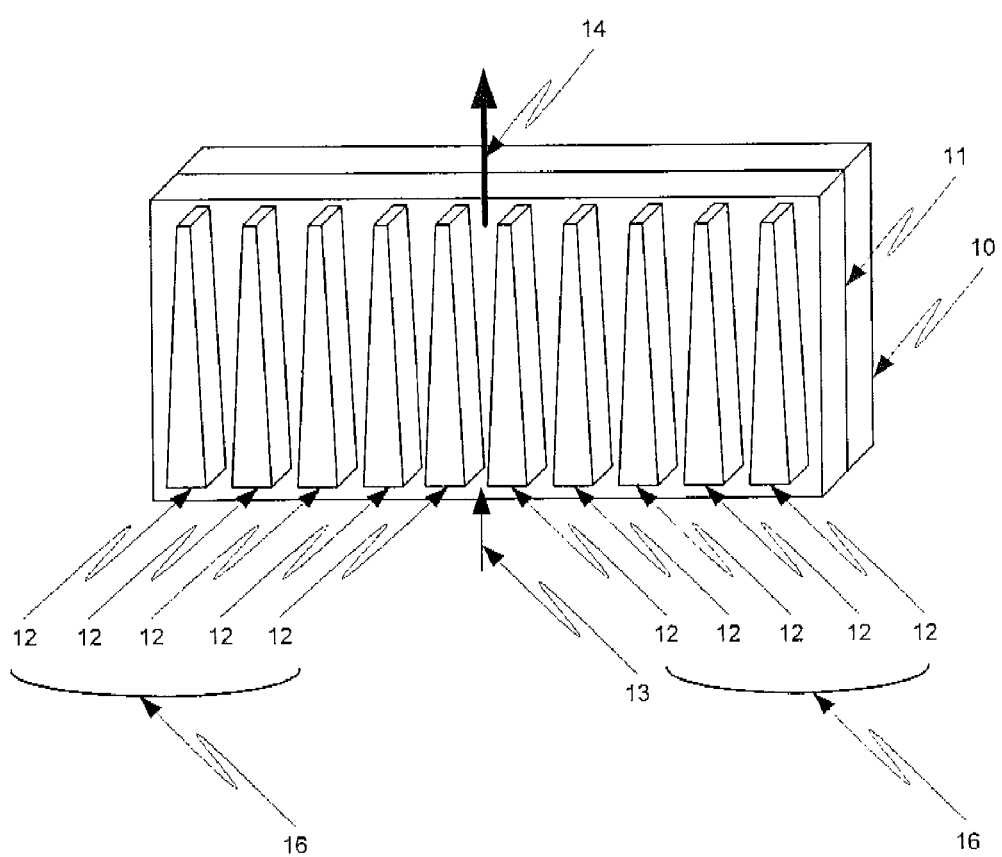
FIG. 1 provides a perspective view of an exemplar heatsink mounted onto a heat source according to the invention.

Heatsinks are designed to dissipate heat or to move heat from one location to another. In one exemplary application, a heatsink is a protective device that absorbs and dissipates the excess heat generated by a system.

Heatsinks are classically designed to have good thermal contact with the heat source. Typically, this involves a heatsink with a first side having a continuous contact area with the heat source and a second side having a large surface area by which heat is dissipated into the environment. Typically, the large surface area side includes a series of fins or posts designed to maximize surface area. Fins and posts are typically constructed out of metal by manufacturing processes, such as extrusion or by machining. However, solely maximizing surface area fails to optimize the physics of heat dissipation. As heat is transported from the heatsink to the environment, the environmental temperature increases. For example, a heatsink is cooled by transferring energy to gas, such as air. As the gas heats, the gas becomes rarefied. Creating a geometry that allows for this rarification or expansion optimizes the efficiency of the function of the heatsink.

Herein, the z-axis is defined along a line opposing gravity. The x-, and y-axes define a plane perpendicular to the z-axis. In some embodiments, a heatsink lies on the x,y-plane along a horizontal surface of a heat source. In additional embodiments, the attachment of the heatsink to the heat source is along an x,z-axis or a y,z axis. In all embodiments, heat rises against gravity along the z-axis.

In a first embodiment of the invention, a heatsink is coupled directly or indirectly to a heat source. The heatsink is equipped with high surface area-to-volume elements that are highly thermally conductive. Examples of high surface area-to-volume heat exchange elements include fins and/or posts. For clarity, the high surface area to volume elements are referred to in parts of the specification as fins and/or posts, though the use of a specific or species description of fins and posts is not intended to limit the generic case of a high surface area-to-volume heat exchange element.

The fins are either integrated into the heatsink or are attached to the heatsink directly through one or more intermediates. The fins are shaped to induce and/or accelerate air flow passively in a vector against gravity along the z-axis. For example, the fins or posts are tapered, such that they gradually decrease in thickness and/or width toward one end of an elongated object. Preferably, the fins or posts are tapered along the z-axis, so that the distance between the fins increases as a function of distance along the z-axis. A gas, such as air, passively moves either, through an entry in the bottom of the heatsink between two or more fins or posts, or from the side into a gap between the fins.

In one case, gas enters near the bottom of the heatsink through an opening between two or more fins. As the gas is thermally heated by the process of at least conduction from the fins, the gas rarefies and expands becoming more buoyant. The more buoyant gas rises and draws additional gas in. The rise of the gas creates a flow of the gas at a velocity over the fins. As the tapered fins allow the gas to continue to expand with minimal resistance, the velocity of gas flow is increased in comparison to the use of fins that are not tapered. Thus, the tapered fins result in higher velocity of gas flow and increased efficiency of cooling.

A key consideration of a pair or set of heat exchange elements is a net increasing distance between two or more elements as a function of distance along the z-axis moving against gravity. Thus, the edges of a given heat exchange element, such as a fin or post, are optionally stepped as a function of z-axis as opposed to smooth. Herein, a smooth wall and a stepped wall, are examples of a generic taper or expansion of area between heatsink elements as a function of z-axis position.

Example I

In a first example of the invention, a heatsink is coupled to a heat source. FIG. 1 provides a perspective view of a heatsink 11 coupled to a heat source 10. In a first case, the heatsink 11 is attached to at least a portion of one side of the heat source 10. In a second case, the heatsink 11 surrounds the heat source 10 or covers a plurality of sides of the heat source 10. The heatsink has a set of heat exchange elements 16, such as a series of fins 12. The fins 12 are either attached to the heatsink 11 or are integral to the heatsink 11. The area, distance, or volume between two or more fins 12 is referred to in a number of ways including: a gap, a channel, a distance between heat dissipating elements, a region between fins, a cross-sectional area, a region between a pair of fins, and an expanding volume along the z-axis. By tapering the fins 12, the distance between the fins 12 increases as a function of height. In this example, a gas, such as air, passively moves either through an entry in the bottom of the heatsink 11 between a pair of fins 12, or laterally into a gap between the fins 12.

In one case, gas enters near the bottom of the heatsink 11 through an opening between two or more fins 12. This is illustrated using a vector representation 13. As the gas is thermally heated by the process of at least conduction from the fins 12, the gas rarefies. The rarefied, or expanded, gas is more buoyant and starts to rise. The rise of the gas creates a lower pressure region that draws additional gas in. The rise of the gas creates a flow of the gas at a velocity over the fins 12. The greater the velocity of the gas, the greater the resultant cooling. The tapered fins 12 allow the gas to continue to expand with minimal resistance allowing for an increase in velocity along the z-axis, as illustrated by a vector representation 14. It is determined that due to the decreased resistance to expansion of the gas, a higher velocity and a larger film coefficient is achieved using tapered fins 12 as opposed to straight fins. Using the tapered fins 12, the resulting higher velocity of gas flow and the resulting increase in the film coefficient results in more efficient cooling.

Example II

Figure 2:
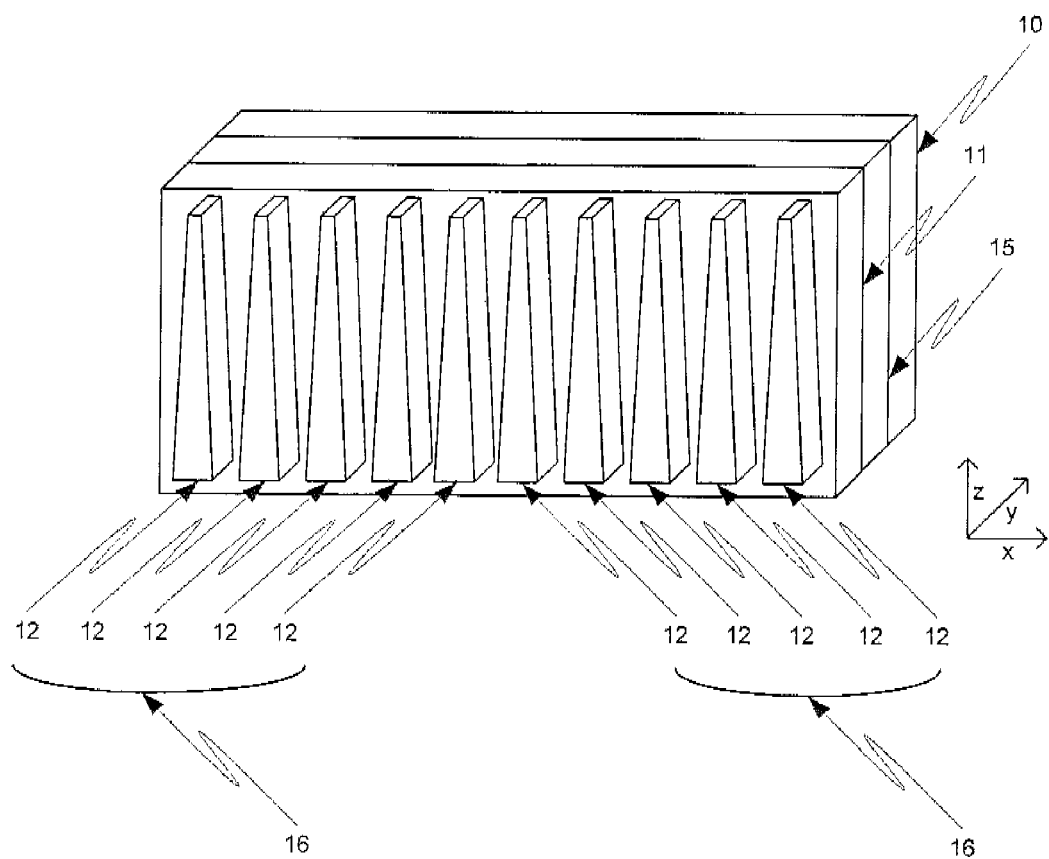
FIG. 2 illustrates a heatsink coupled to a heat source via coupling means according to the invention.

A second example of the invention is presented schematically in FIG. 2. A heat source 10 is coupled to a heatsink 11 through intermediate means 15, such as a thermally conductive material or a heatpipe. The intermediate means is optionally a layer. The intermediate means 15 are designed to move heat from the heat source 10 to the heatsink 11. The intermediate means cover at least part of the heat source 10 and the heatsink 11 covers at least part of the intermediate layer. Optionally, two, three, or more intermediate means or materials are used. The heatsink is preferably constructed with a set of two or more heat exchange elements, such as a set of fins 12, designed to induce and increase air flow across the heatsink passively.

Example III

Figure 3:
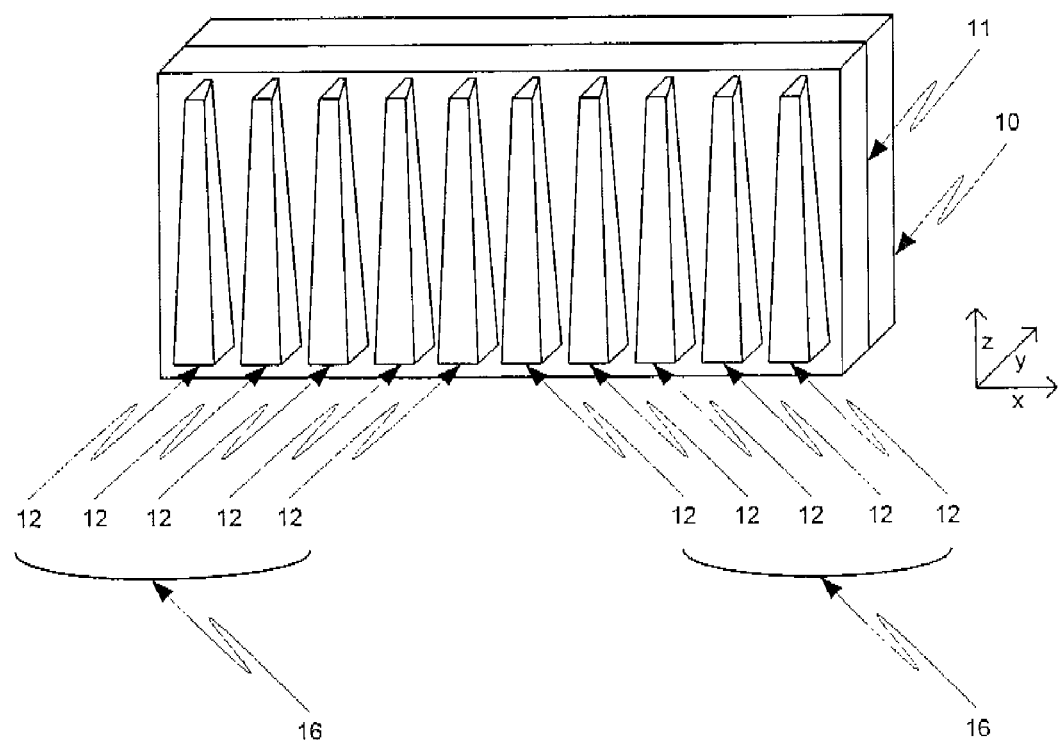
FIG. 3 provides an example of a heatsink with heat dissipating elements tapered along multiple axes according to the invention.

FIG. 3 illustrates a third example of the invention. In this example, a heatsink 11 covers, directly or indirectly, at least a portion of a surface of a preferably vertically orientated heat source 10. A set of heat exchange elements, illustrated as fins 12 are integrated into the heatsink 11 and are tapered in two-dimensions. The distance between the fins 12 is tapered along the z-axis as in Example I. In addition, the fins 12 are tapered between the outmost surface of the fin and the contact with the heatsink 11. This allows the gas to expand and rise upward with a component vector toward the heatsink 11. This results in a larger airflow and more contact area with the base portion of the heatsink 11, which is typically hotter than the outermost portion of the fins 12. Thus, tapering the fins in at least-two dimensions increases the efficiency of the heatsink. Optionally, the heat dissipating element, such as a cone or fin, is tapered along three-dimensions. In addition, tapering of a heat dissipating element 12 is optionally performed on any face. For example, a rectangular heat dissipating element is optionally tapered on one to six sides.

Example IV

In a fourth example of the invention, a heatsink 11 with fins 12 is coupled to a heat source as in any of the examples herein. In this example, the interface of the fins 12 with the base of the heatsink 11 is rounded. Having a radius at the interface of a first heat dissipating element 12 and a second heat dissipating element 11 has at least two benefits. First, the round edge or radius adds mechanical strength to the heat dissipating element 12. This helps to prevent damage to the element 11, such as snapping off under applied force. Second, dead air space is minimized, where upward velocity of the cooling gas is restricted thereby increasing or maximizes the upward movement of the cooling gas.

Example V

Figure 4:
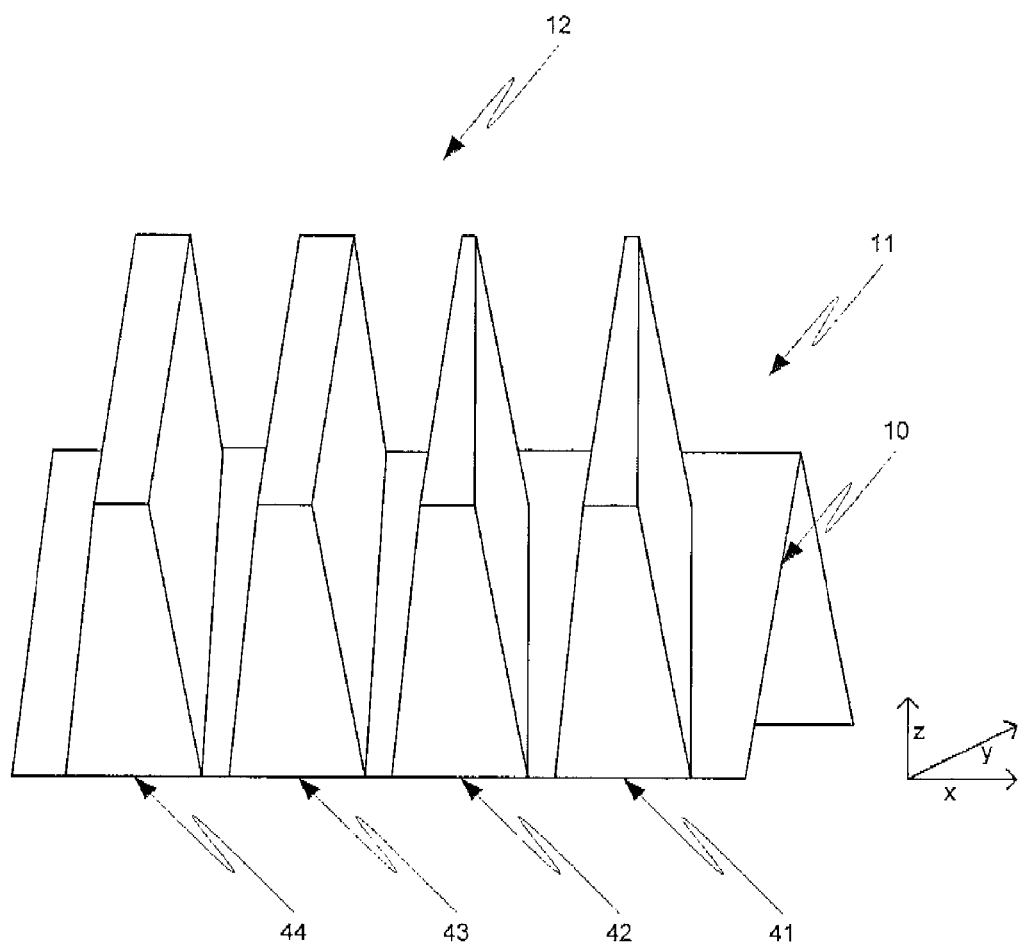
FIG. 4 illustrates function of a heatsink (A) on an inclined plane and (B) with two regions of the heatsink dissipating heat at different rates according to the invention.

In a fifth example of the invention, a heatsink is coupled to an inclined plane. FIG. 4 shows a heat source 10 coupled to a heatsink 11. In one case, the heat source 10 is directly attached to a set of fins 12. In a second case, the heatsink 10 is directly or indirectly coupled to a base of a heatsink 11. The base of the heatsink 11 is coupled to a heat dissipating element, such as a fin. Four fins are illustrated 41-44. In the illustrated example, all of the four fins 41-44 are mounted onto the inclined plane. Fins 43 and 44 are both designed to have one axis that is tapered in order to allow the flowing gas to expand with increased temperature. In a first instance, gas flows between the similar fins 43 and 44 and rises up through the taper. Two fins 41, 42 are designed with tapers along two axes. In a second instance, gas flows up the inclined plane and/or up the z-axis between a pair of fins 41, 42 with two axes of tapering. In a third instance, gas flow between two fins 42, 43 that are of different design.

A heat source 10 often distributes heat differently to different regions. Heatsinks are, optionally, designed to a heat difference. Therefore, a heatsink 11 optionally has a plurality of regions having differing cooling fins. For example, a heat source with two levels of heat is coupled to a heatsink 11 with two regions. The first region is designed with a first set of heat dissipation elements for the first level of heat to be removed and the second region is designed with a second set of heat dissipation elements for the second level of heat to be removed. The two pairs of fins 41, 42 and 43, 44 are illustrative of dissipating heat differently from a first region and a second region.

Example VI

Figure 5:
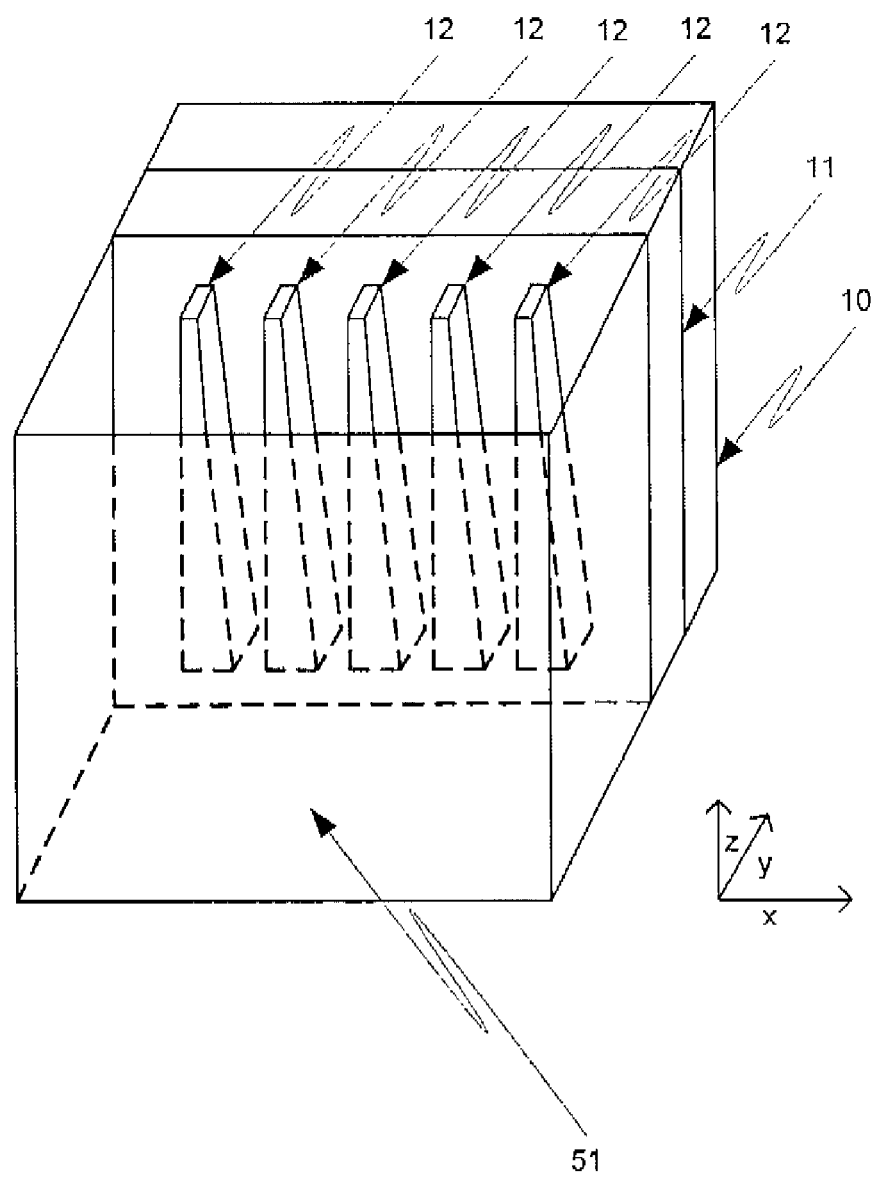
FIG. 5 provides a perspective drawing of a heatsink in a flue according to the invention.

In a sixth example of the invention, a heat source is coupled to a heatsink, which is placed internally on at least part of a perimeter of a hole to a heat source. Herein, a hole is also referred to as a chimney flue, pipe, tube, or channel used for conveying heated air or fluid. The hole is of any geometry. FIG. 5 shows an example of a heatsink 11 internal to an object about a hole 51. In the illustrated case, a rectangular chimney flue 51 is presented with a heatsink 11 at least partially surrounding the flue 51. A heat source 10 is coupled to the heatsink 11. For clarity of presentation, the heatsink 11 and heat source 12 are illustrated on only one side of the flue 51 in the present case. Heat is pulled from the heat source 10 to a heatsink 11 having fins tapering away from each other along the z-axis. As described, supra, an air flow is accelerated as it expands due to increasing temperature between fins 12. The flue 51 additionally serves to provide an upward movement of air or gas along the z-axis. This accelerates the cooling of the heat source 10 through the process of convection coupled to conduction via the heatsink 11. In some instances, radiative processes also contributes to heat exchange.

Example VII

In a seventh example of the invention, a set of two or more heat exchange elements, such as a set of fins, are used inside and outside of a heat source. The distance between a pair of heat exchange elements increases along the z-axis in order to enhance buoyancy of the air or gas as explained herein. A set includes two or more heat exchange elements and optionally includes any number of heat exchange elements, such as about 10, 50, 100, 500, or 1000 heat exchange elements.

Example VIII

In an eighth example of the invention, a post array is used to exchange heat from one or more surfaces perforated with holes. For example, a two by six array of heat exchange elements is used. In general an m by n array of posts, where m and n are integers greater than or equal to one, is used. In another case, a pattern of heat exchange elements, where the number of heat exchange elements is a positive integer, is used where the number of heat exchange elements are optimized and/or adjusted to the specific application. For example, about 2, 5, 10, 20, 50, 100, 500, or 1000 heat exchange elements are used. The key feature is that the open volume between a pair or a set of heat exchange elements increases along at least one of the x-, y, or combination of x,y-axes as a function of distance along the z-axis. The number of holes or perforations is an integer greater than or equal to one.

Figure 6:
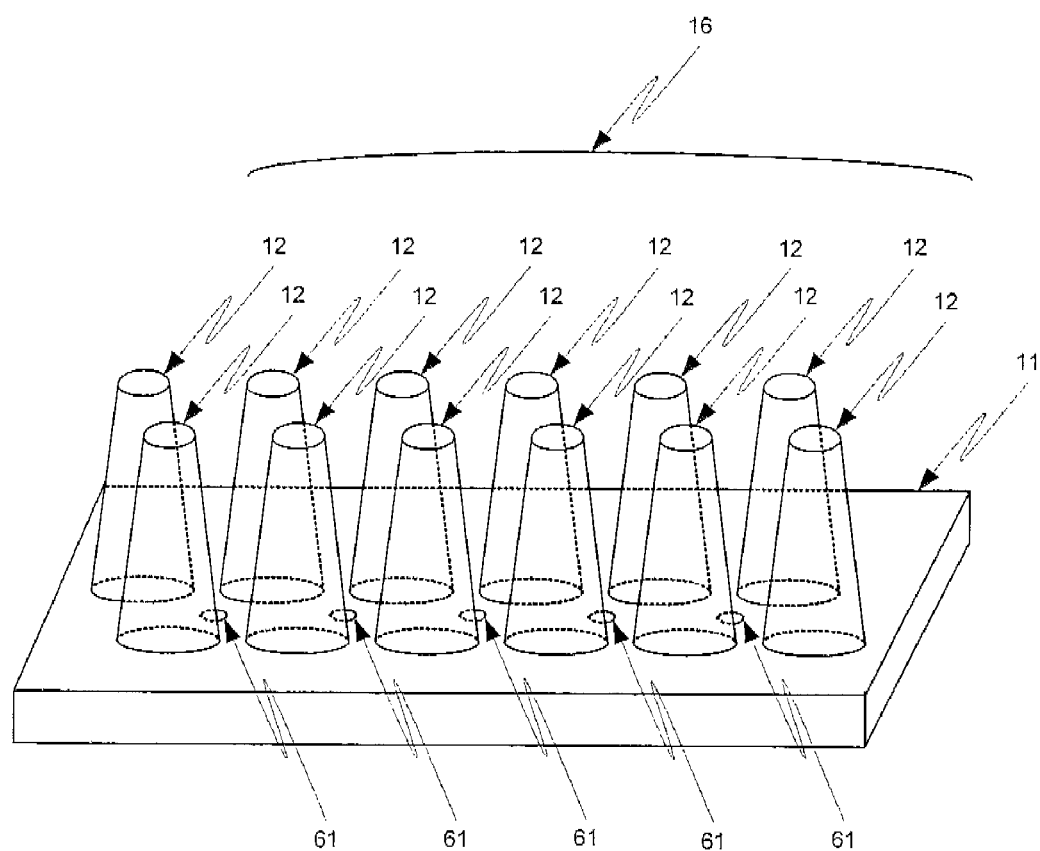
FIG. 6 illustrates an exemplary array of tapered heatsinks according to the invention.

FIG. 6 shows a perspective view of an exemplary array of heat exchange elements. In the pictured embodiment, a two by six array of posts 12 is illustrated as attached to a heatsink 11. The resulting heat exchange plate is an example of a heatsink 11. In this case, the base of the heatsink 11 is perforated with a set of holes 61. The posts are tapered to increase the distance between two, three, or four posts. As described herein, the taper increases the velocity of air flow past the heat exchange elements 12 resulting in increased efficiency of cooling. In addition to an array layout of heat exchange elements, heat exchange elements are alternatively attached to the heatsink in any pattern.

Example IX

Figure 7:
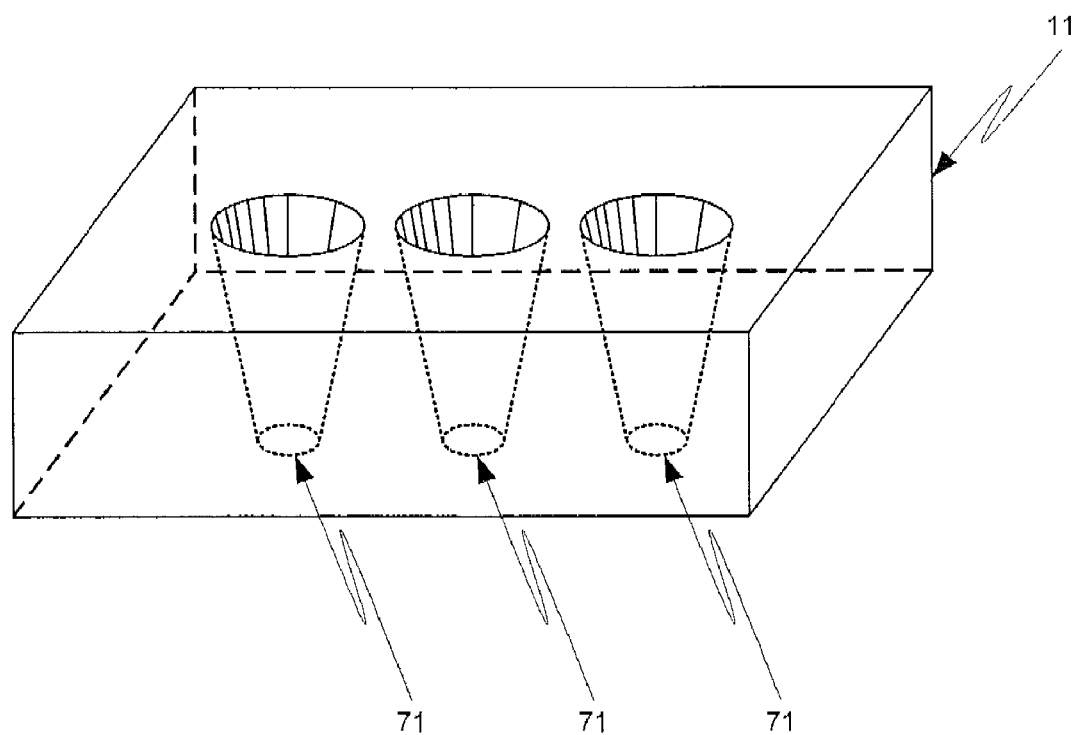
FIG. 7 illustrates the use of expanding holes as a heat exchanger according to the invention.

In a ninth example of the invention, a heat exchange plate and/or a heatsink is configured with an integral number of holes, where the integral number is positive. FIG. 7 shows an exemplar perspective embodiment of a heatsink 11 configured with a set of holes 71. Each hole 71 is optionally shaped with one or more facets, such as a three, four, or more sided pyramid, a borehole, a countersink, or an expanding cylinder, or any geometric shape generally expanding along the z-axis. In a manner related to that described in the examples throughout this specification, air enters a bottom opening of a hole 71, warms through conduction, and rises at an accelerated rate toward a top opening of a hole 71 as the gas rarefies. Heat is thus removed from a plate or heatsink 11. The heatsink 11 optionally is configured with traditional fins, traditional posts, or with a set of tapered heat exchange elements. The heatsink 11 is interfaced to a heat source on one or more sides. Optionally, the plate illustrated as a heatsink 11 is a heat source.

Example X

In a tenth example of the invention, a portion or all of any of the tapered heatsinks or parts thereof, such as a fin or post, described herein are coated with one or more layers. The coating is preferably a highly thermally conductive material that enhances heat exchange and hence cooling of a heat source. Any metal or plastic of enhanced thermal conductivity compared to the thermal conductivity of the heatsink increases efficiency of the heatsink. In addition nonmetals, such as diamond dust, are optionally used for one of more of the coating layers. A coating layer is optionally rough, which creates a turbulent flow in place of a laminar flow next to the heat exchange element. In some cases, a turbulent flow next to the heat exchange element increases the rate of heat exchange thereby increasing cooling efficiency. The optional rough coating layer increases the surface area-to-volume ratio to aid in heat dissipation in some cases.

Example XI

Figure 8:
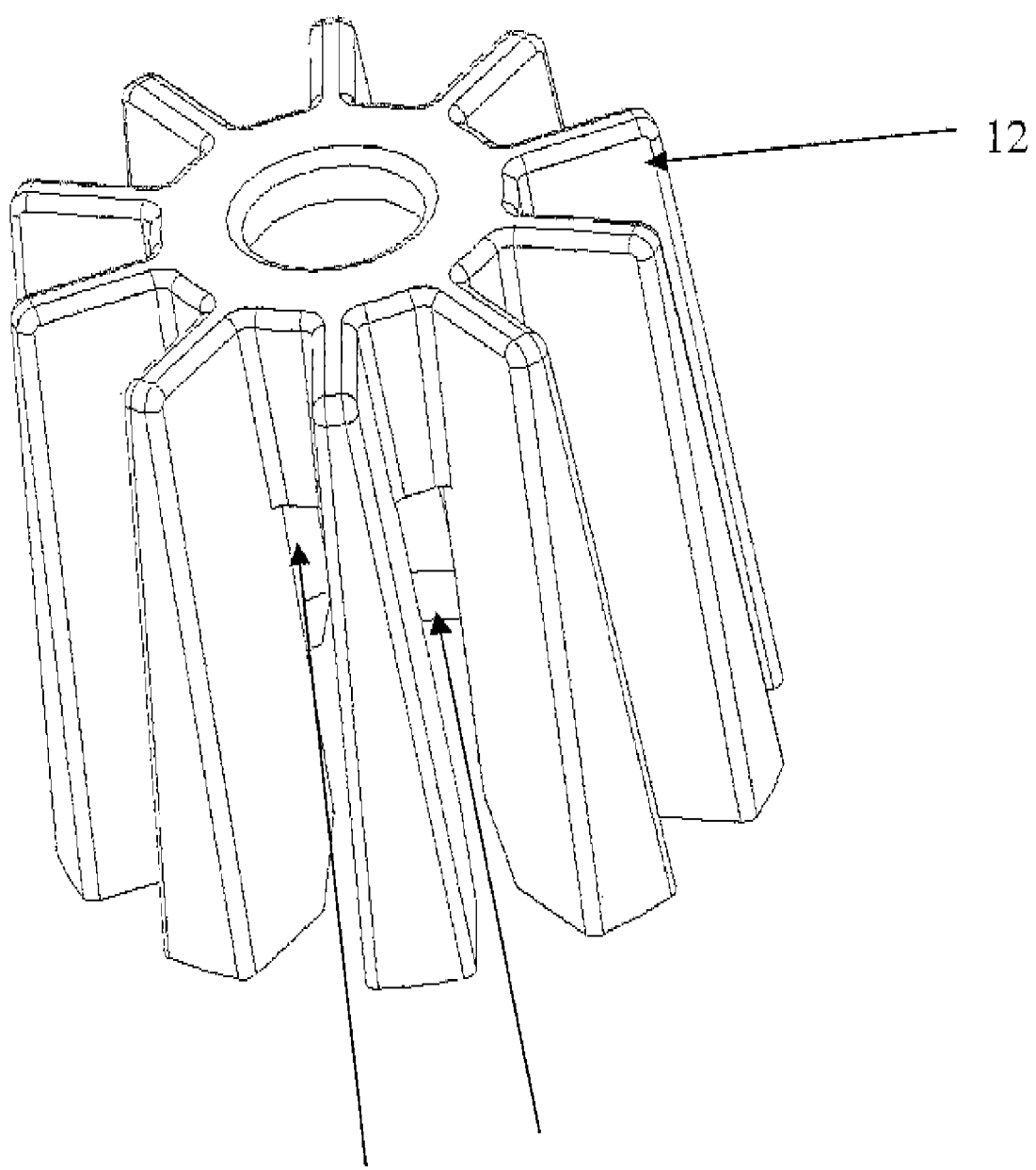
FIG. 8 illustrates a perspective drawing of a set of heatsinks around a cylindrical heat source according to the invention.

In an eleventh example of the invention, a heatsink covers all or a portion of the periphery of a curved or rounded surface. FIG. 8 shows a heatsink 11 coupled to a heat source 10. In this example, a heatsink 11 goes around at least a portion of the periphery of the heat source 10. A set of fins 12 are either attached to the heatsink 11, or are integrated into the heatsink 11. Heat is drawn from the heat source 10 into the cooling fins 12. Air flows next to a fin, preferably between two or more fins. As the air is heated, it becomes buoyant and rises. The distance between fins 12 increases as a function of distance up the z-axis. The increased distance between the fins 12 results in decreased resistance to expansion of the air upon heating. The rising air passively creates an air flow by the fins 12 resulting in cooling. The tapered fins 12 are determined to result in increased air flow and resultant cooling compared to non-tapered fins. In one case, a light source is coupled to a heatsink 11 via conduction means, such as a metal ring or a thermally conductive plastic.

Example XII

Figure 9:
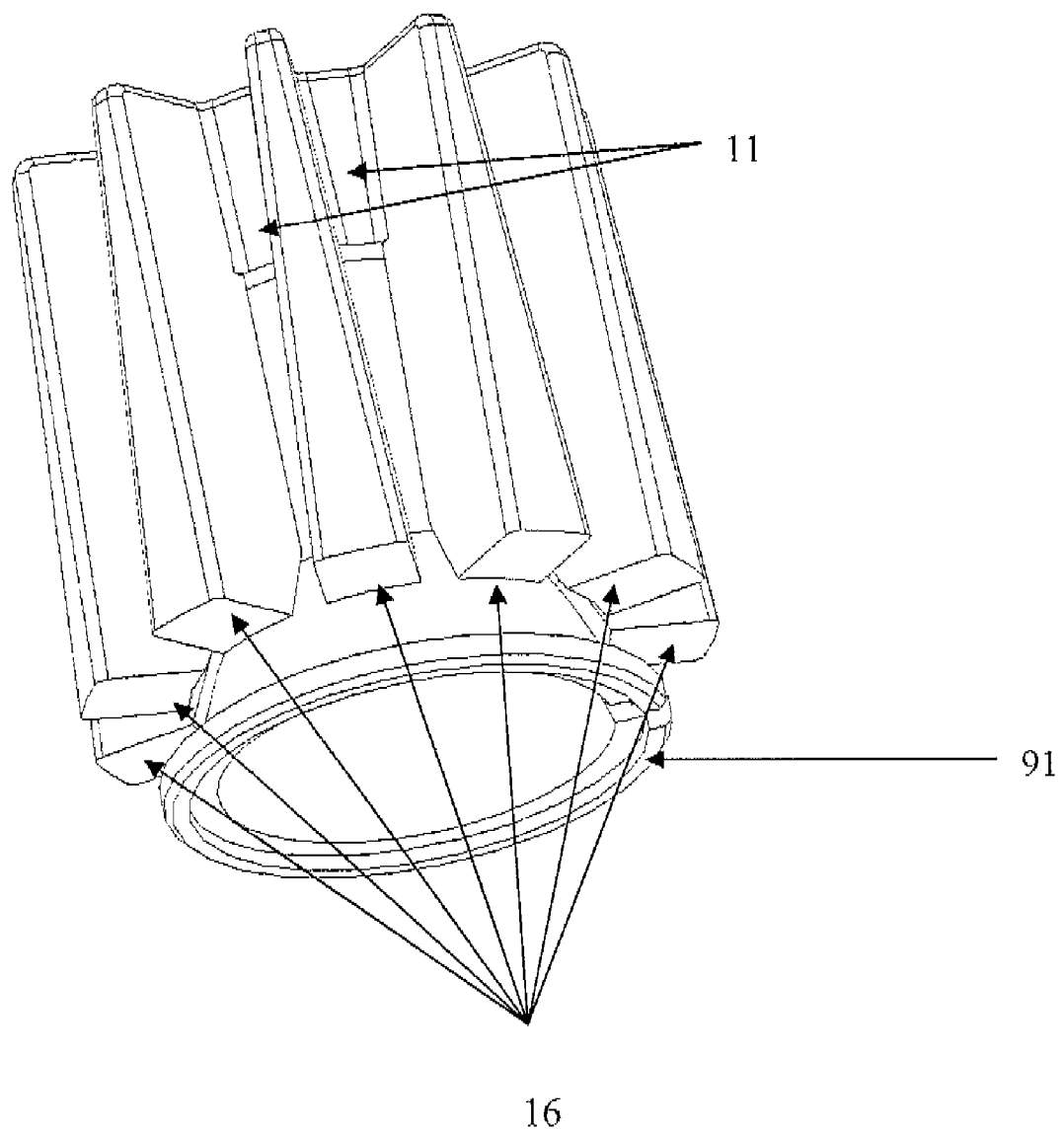
FIG. 9 is a perspective drawing of a heatsink about an optical source of photons according to the invention.

In a twelfth example, a heatsink is coupled directly or indirectly to a light source, such as a light bulb. FIG. 9 shows a set of heat exchange elements, such as fins, of a heatsink 11. A light source sits in the internal area between the fins 16. The light source is not pictured as the view of the source is obstructed by an optional backreflector 91. The filament of the light source emits light at a solid angle resulting in some light hitting a backreflector 91. Heat from the source also conducts through a base of the light source. The base is preferably coupled to the heatsink 11 which, in turn, has a set of heat dissipating elements 16, such as fins, to help dissipate the heat. Optionally, the light source is part of a spectrometer or analyzer. In one case, the light source is part of a noninvasive analyzer, such as a noninvasive glucose concentration analyzer operating in the near-infrared spectral region. The heatsink allows for construction of a handheld analyzer, which is passively cooled and/or lightweight. Examples of noninvasive analyzers are described in G. Acosta, J. Henderson, N. Abul-Haj, T. Ruchti, S. Monfre, T. Blank, and K. Hazen, Compact Apparatus for Noninvasive Measurement of Glucose through Near-Infrared Spectroscopy, U.S. patent application Ser. No. 10/472,856, filed Mar. 7, 2003, which is herein incorporated in its entirety by this reference thereto.

Example XIII

In a thirteenth example of the invention, a heatsink as described, supra, optionally includes at least one rough surface area. The rough area creates a turbulent flow in place of a laminar flow next to the heatsink or elements of the heatsink. In some cases, a turbulent flow next to the heatsink element increases the rate of heat exchange, which increases cooling efficiency. The optional rough coating layer increases the surface area to volume ratio of the heatsink, which aids in heat dissipation in some cases.

Example XIV

In another example of the invention, a heatsink includes parallel heat dissipation elements, such as fins. A side of the heatsink base is attached to a plurality of heat dissipation elements. The side of the heatsink attached to the plurality of heat dissipation elements slants away from the outer edge of the outer edge of the heat dissipation elements. Thus, an expanding volume as a function of a distance up the z-axis is achieved by the wall slanting away from the outer edge of the heatsink. The expanding volume allows freer expansion of the gas as described, supra. By expanding the air volume into the heatsink base, a larger number of fins are optionally connected to a given section of the heatsink base resulting in increased cooling efficiency.

Example XVI

In yet another example of the invention, the plastic deformation of a thermally conductive polymer used in a heatsink, as described herein, is used to fasten parts together.

Permutations and combinations of the examples provided heretofore are considered to be part of this invention. Further, the examples herein are illustrative in nature and are not intended to limit the scope of the invention in any way.

Thermally Conductive Polymer

In an alternative embodiment of the invention at least part of a heatsink, as provided in the above examples, is formed with a highly thermally conductive polymer, which is either machined or extruded to form a shape for the heatsink.

Typically, heatsink elements, such as fins or posts, are made by the process of extrusion of metal resulting in fins or posts that are not tapered. In one case, fins with a complex shape are created through a series of complex machining steps. Machining parts is limited by the substrate being machined. For example, the shape, thickness, and size of a part is limited by machining techniques for metal. In addition, machining takes time, costs money, and creates a practical limit of the complexity of the resulting shape of a fin and/or heatsink. In a second case, a heat dissipation element, such as a heatsink or a heatsink element, such as a post or fin, is created using an injection molding process. Injection molding allows the creation of complex shapes. Injection molding is performed with a highly thermally conductive polymer. Examples of a highly thermally conductive polymers are the E-Series thermally conductive polymers, such as the E2 resin based upon a liquid crystalline polymer, available at Cool Polymers, Inc. (Warwick, R.I.). Additional examples of E-Series polymers include: E3601, E3603, E4301, E4501, E1201, E5101, E5105, and E8401. Tri-Mack (Bristol, R.I.) provides thermally conductive plastic parts formulated to function up to 600° F. with thermal conductivity values in excess of 20 W/m-K. Examples of high thermal conductive values include: values greater than about 5, 10, 15, 20, or 25 W/m-K. In its broadest sense, an injection molded material of high thermal conductivity is used to make a heatsink. In general, the injection molding of the heatsink or components or element thereof uses any highly thermally conductive material that is injection moldable. Examples of moldable materials include: a filled plastic, a blended plastic, a plastic blended with a high thermal conductivity material, a plastic containing a directional filler, a plastic containing a non-directional filler, an epoxy containing a metal, such as silver, copper, or gold, and an epoxy containing a high thermal conductivity material. In exemplary cases, the entire heatsink with all elements is injection molded as a single piece; one or more elements of a heatsink, such as a fin or post, are injection molded separately; or an array of heatsinks are injection molded as a single unit.

Injected molded parts have several advantages. First, the thermal conductivity of thermally conductive polymers are similar to some metals. For example, the E2 polymer has a thermal conductivity of 20.0 W/m-K comparable to that of stainless steel having a thermal conductivity of 14.4 W/m-K. Second, the weight of a thermally conductive polymer is typically less than that of metal allowing for the formation of lighter weight parts. For example, the E2 polymer weighs forty-percent less than aluminum. Third, an increased ratio of heat efficiency of cooling to weight is typically achieved. Fourth, precision and accuracy of manufacture eases assembly of components and in some cases increases precision of alignment of assembled products. Fifth, unwanted interface requirements, such as a bonding agent or a metal interface, are optionally removed. Removal of the unwanted interfaces results in lower cost and the removal of a potentially unwanted thermal resistance. Sixth, injection molding allows for the fast, inexpensive, and reproducible production of parts that are accurate and precise. In addition, polymers have thermal, mechanical, electrical, and physical advantages. Injection molding the heatsink or parts of the heatsink has many benefits including production of parts that is:

- light weight;
- highly thermal conductive;
- readily manufactured in large quantity;
- accurate;
- precise;
- heat transfer efficient; and
- inexpensive in quantity.

Non-Passive Heatsink

In yet another embodiment of the invention, any of the heatsinks described herein are used in combination with an air flow. Examples of types of airflow includes airflow forced via forcing means, such as a fan, or pulled via pulling means, such as a vacuum. Preferably, the heatsinks described herein are used passively. However, the heatsinks described herein are optionally used in combination with a flow of air, gas, or liquid.

Application

Applications of the heatsinks provided herein are numerous and varied. Example applications include use in cooling a heat source in, on, or from any of:

- a medical device;
- an electronic device;
- a computer element;
- an integrated circuit;
- a transistor;
- a graphic processor unit;
- a heatpipe; and
- a Peltier cooler.

Additional examples include:

- integrating a heatsink into a larger apparatus;
- combining with a bonding agent;
- coating with a highly thermally conductive layer; and
- coating with a reflective surface.

Examples of a coated reflective surface include: a mirror, a reflector, and an optic.

Variables

The heatsinks discussed, supra, have a number of elements that are optionally optimized to an application. In one case, generic versions of the heatsinks are couple to heat sources. In a second case, one or more elements of the heatsink are varied to enhance heat transfer for an application. For example, for a larger heat difference between a heatsink fin and the environment, such as air, a larger angle of tapering is typically used. Variable elements include:

- geometry of a heatsink;
- geometry of an element of a heatsink;
- number of heatsink elements;
- layout of heatsink elements;
- height of an element, such as a fin or post;
- rate of expansion of gas;
- temperature of heat source;
- temperature of environment;
- delta temperature between heat source and environment;
- origin of airflow;
- material composition;
- angle of tapering;
- use of additional cooling apparatus in combination with a heatsink as provided herein;
- a coating layer composition; and
- airflow rate, in applications where air flow is used.

The heatsink geometry and/or shape is optionally engineered using experience, engineering tools, trial and error, and/or computation fluid dynamic software where the computation fluid dynamic software is used to optimize at least one heat transfer property. Optionally, one or more iterations are used to identify the optimal geometry of a heatsink for a given application. Types of geometries having taper include change in cross section area between two or more heat exchange elements that increases as a function of distance along the z-axis in a stepped manner, in a linear manner, in an exponential fashion, or as a polynomial expansion.

Figure 10:
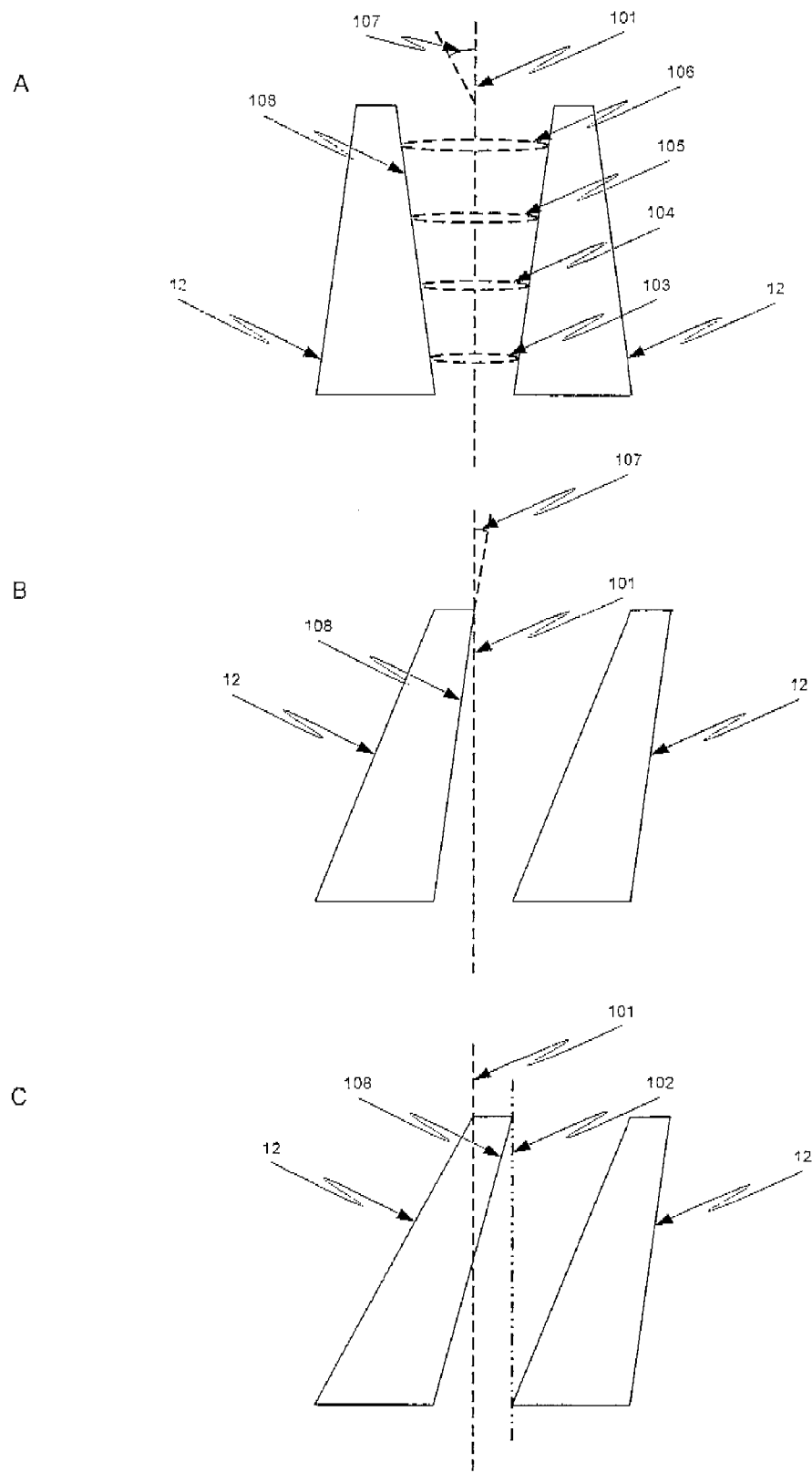
FIG. 10A-C illustrates exemplar angles and areas between heatsink elements according to the invention.

FIG. 10 shows two fin type heat exchange elements 12. First, in FIG. 10A, a cross sectional area between two heat exchange elements is illustrated as a series of ellipses 103-106. As a function of distance along the vertical z-axis, the cross sectional area between two or more heat exchange elements increases. As illustrated the cross section area at a first point along the z-axis 103 is less than the cross sectional area at a second point along the z-axis 104; which is less than the cross sectional area at a third point along the z-axis 105; which is less than the cross sectional area at a fourth point along the z-axis 106. Second, FIG. 10 also illustrates an angle theta off of the z-axis 101. FIG. 10A illustrates a negative angle theta 107, such as about −1, −2, −4, −6, −8, −10, and −15 degrees. FIG. 10B further illustrates a positive angle theta 107, such as about 1, 2, 4, 6, 8, 10, 15, or 20 degrees. For instance one or more sides or facets 107 of a heat element 108 lies at an angle theta off of the z-axis in combination with the x- and/or y-axes. Third, FIGS. 10A-C illustrates examples of one or more sides or facets 108 of a heat exchange element leaning away from, hitting, or leaning through a z-axis centered in a bottom opening between two or more heat exchange elements. Preferably there exists at least one vertical line 102 from a bottom opening and a top opening between two of more heat exchange elements 12 that does not cross a heat exchange element.

Those skilled in the art will recognize that the present invention may be manifested in a variety of forms other than the specific embodiments described and contemplated herein. Departures in form and detail may be made without departing from the spirit and scope of the present invention. Accordingly, the invention should only be limited by the Claims included below.

The invention claimed is:

1. An apparatus for heat transfer, comprising:
   a connecting member; and
   at least two heat exchange elements;
   wherein said at least two heat exchange elements are either, integrated into said connecting member or attached to said connecting member;
   wherein said at least two heat exchange elements form a trough between them, said trough having a bottom opening and a top opening, wherein at least a portion of said top opening is vertically aligned with at least a portion of said bottom opening; and
   wherein cross-sectional area between said heat exchange elements increases as a function of vertical distance along a z-axis, wherein said z-axis aligns with gravity.

2. The apparatus of claim 1, wherein said apparatus further comprises:
   a coating covering substantially all of a at least a portion of any of:
   said connecting member; and
   said heat exchange elements.

3. The apparatus of claim 2, wherein said coating comprises a rough surface, wherein said rough surface enhances turbulence of air flowing across said rough surface.

4. The apparatus of claim 1, wherein at least one of said connecting member and said at least two heat exchange elements comprises any of:
   an injection molded material; and
   a thermally conductive plastic.

5. The apparatus of claim 1, wherein said thermally conductive plastic comprises:
   a material having a heat transfer coefficient of at least ten W/m-K, where W is heat in Watts, m is distance in meters, and K is temperature in degrees Kelvin.

6. The apparatus of claim 1, wherein at least one of said heat exchange elements comprises any of:
   a fin; and
   a post.

7. The apparatus of claim 1, wherein at least one of said heat exchange elements comprises:
   a taper on at least two sides.

8. A method for heat transfer from a heat source, comprising the steps of:
   providing a heatsink connected to said heat source;
   providing at least two heat exchange elements;
   wherein said at least two heat exchange elements are either integrated into said heatsink or attached to said heatsink;
   forming a trough between said at least two heat exchange elements, said trough having a bottom opening and a top opening;
   vertically aligning at least a portion of said top opening with at least a portion of said bottom opening;
   wherein cross-sectional area between said heat exchange elements increases as a function of vertical distance along a z-axis, wherein said z-axis aligns with gravity; and
   dissipating heat from a heat source using said heatsink.

9. The method of claim 8, further comprising the step of:
   either directly or indirectly coupling said heatsink to said heat source.

10. The method of claim 8, wherein said heatsink passively increases airflow.

* * * * *